(12) United States Patent
Adan

(10) Patent No.: US 6,288,425 B1
(45) Date of Patent: Sep. 11, 2001

(54) SOI-MOSFET DEVICE

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/099,107

(22) Filed: Jun. 18, 1998

(30) Foreign Application Priority Data

Sep. 5, 1997 (JP) .................................................. 9-241482

(51) Int. Cl.⁷ .................................................. H01L 27/01
(52) U.S. Cl. .......................................... 257/347; 257/349
(58) Field of Search ................................ 257/349, 347, 257/260, 382, 408

(56) References Cited

U.S. PATENT DOCUMENTS

| | | | |
|---|---|---|---|
| 4,563,805 | * 1/1986 | Scovell et al. | 438/664 |
| 4,965,213 | 10/1990 | Blake | 437/21 |
| 5,296,727 | 3/1994 | Kawai et al. | 257/260 |
| 5,463,237 | 10/1995 | Funaki | 257/336 |
| 5,894,151 | * 4/1999 | Yamazaki et al. | 257/349 |

FOREIGN PATENT DOCUMENTS

| | | |
|---|---|---|
| 56-78156 A | 6/1981 | (JP) . |
| 62-133762 A | 6/1987 | (JP) . |
| 2-178965 A | 7/1990 | (JP) . |
| 5-218425 A | 8/1993 | (JP) . |
| 9-293871 A | 11/1997 | (JP) . |

* cited by examiner

*Primary Examiner*—Mark V. Prenty
(74) *Attorney, Agent, or Firm*—Nixon & Vanderhye P.C.

(57) ABSTRACT

A SOI.MOSFET includes: a substrate; a buried oxide film formed on the substrate; a top semiconductor layer formed on the buried oxide film; a gate electrode formed on the top semiconductor layer with a gate oxide film interposed therebetween; source/drain regions of a second conductivity type formed in the top semiconductor layer and on both sides of the gate electrode; and an embedded region of the second conductivity type which is disposed in the top semiconductor layer and between the source/drain regions and is separated from the source/drain regions and from a top semiconductor/gate oxide interface.

14 Claims, 6 Drawing Sheets

SOI-MOSFET DEVICE

CROSS-REFERENCES TO RELATED APPLICATIONS

This application is related to Japanese Patent Application No. HEI 9(1997)-241482 filed on Sep. 5, 1997 whose priority is claimed under 35 USC §119, the disclosure of which is incorporated herein by reference in its entirety.

BACKGROUND OF THE INVENTION

1. Field of the Invention

The present invention relates to a SOI.MOSFET (Silicon-On-Insulator Metal Oxide Semiconductor Field Effect Transistor) and a fabrication process therefor. More particularly, the present invention relates to a SOI.MOSFET having a region embedded within a channel region and separated from source/drain regions, and a fabrication process therefor.

2. Description of the Related Arts

MOSFETs fabricated on a SOI substrates such as SOS (Silicon On Sapphire), SIMOX (Silicon Separation by ion implantation of Oxygen) and BSOI (Bonded SOI), offer advantages in low-voltage and high-speed operation. Additionally, SOI.MOSFETs have only three terminals (Gate, Drain and Source), while devices fabricated on a bulk Si require four terminals (Gate, Drain, Source and Substrate). Accordingly, SOI MOSFETs have a comparatively simple construction and result in a smaller layout area as compared with bulk Si devices.

FIGS. 4(a) and 4(b) show a schematic cross section of a conventional MOSFET formed on a bulk Si and its equivalent electrical circuit, also showing a bipolar NPN transistor generated parasitically in this MOSFET structure. In this MOSFET, a gate electrode 23 is formed on a silicon substrate 20 with a gate oxide film 22 interposed therebetween, and source/drain regions 21 are formed in the silicon substrate 20. Therefore, a base terminal of the parasitic NPN bipolar transistor generated by the source/drain regions 21 and the silicon substrate 20 is tied to the substrate terminal, and the substrate/source junction is reverse biased. As a result, the bipolar NPN transistor has very little effect on the MOSFET operation.

On the other hand, FIGS. 5(a) and 5(b) show a schematic cross section of a conventional SOI.MOSFET and its equivalent electrical circuit, also showing a bipolar NPN transistor generated parasitically in this SOI.MOSFET structure. In this SOI.MOSFET, a silicon oxide film 32 and a top semiconductor layer are successively formed on a silicon substrate 31; a gate electrode 35 is formed on the top silicon layer with a gate oxide film 34 interposed therebetween; and source/drain regions 33 are formed in the top silicon layer. Therefore, a parasitic bipolar base is floating. In normal operation, holes generated by impact ionization at a drain junction could act as a base current for the parasitic bipolar NPN transistor, creating a positive feedback effect and degrading device electrical characteristics, especially short-channel effect and reduction of a drain/source breakdown voltage. In the case of the SOI.MOSFET with thick top Si channel, it operates in the partially depleted mode, and holes generated by impact ionization flow into a neutral region under the channel, raising a channel potential to increase a drain current, which further increases the number of holes. This leads to a so-called "kink" effect in output characteristics, representing a serious limitation of the SOI.MOSFET.

Possible methods to overcome this limitation are:

a) A use of a SOI.MOSFET constructed on a thicker top Si film and using body contacts to tie a channel region to a fixed potential: this behaves as a bulk Si device suppressing a floating body effect and a parasitic bipolar effect.

However, this method is accompanied by a drawback that the SOI.MOSFET with the channel region tied to the fixed potential by the body contacts consumes area, and the body contact becomes ineffective when the body is fully-depleted.

b) A use of a SOI.MOSFET with a channel region constructed in a low doped thin top Si film in such a way that the channel region is fully depleted. The fully-depleted SOI.MOSFET is theoretically free of the "kink" effect.

However, this method is accompanied by a drawback that, although the "kink" effect is eliminated, it requires the thin top Si film that complicates fabrication processes.

c) A use of a SOI.MOSFET proposed in Japanese Unexamined Patent Publication No. SHO 62(1987)-133762. This device, which is schematically illustrated in FIG. 6, has a channel body 40 of N-type and a surface channel 41 of P-type. The "kink" effect is prevented due to recombination of a impact ionization generated holes in the N-type channel body 40. To prevent leakage current between source/drain regions 42 through the N-type channel body 40, this must be fully-depleted.

This structure, however, is susceptible to a Short-Channel Effect (SCE) and punch-through, and this SCE will give rise to sub-channel leakage.

e) A use of a SOI.MOSFET described in Japanese Unexamined Patent Publication No. HEI 2(1990)-178965. This device, which is schematically illustrated in FIG. 7, has a conductor 50 formed in a channel region and tied to a substrate potential.

This device, however, consumes area and complicates fabrication processes, as in the above case a).

SUMMARY OF THE INVENTION

The present invention provides a SOI.MOSFET comprising: a substrate; a buried oxide film formed on the substrate; a top semiconductor layer formed on the buried oxide film; a gate electrode formed on the top semiconductor layer with a gate oxide film interposed therebetween; source/drain regions of a second conductivity type formed in the top semiconductor layer and on both sides of the gate electrode; and an embedded region of the second conductivity type disposed in the top semiconductor layer and between the source/drain regions and is separated from the source/drain regions and from a top semiconductor/gate oxide interface.

Also, the present invention provides a process of fabricating the above-mentioned SOI.MOSFET, comprising the steps of: (i) forming a buried oxide film and a top semiconductor layer of a second conductivity type successively on a substrate;(ii) implanting impurity ions of a first conductivity type into a surface of the top semiconductor layer thereafter; (iii) forming a gate electrode on the resultant substrate; and (iv) forming a deep channel portion of the first conductivity type underneath the gate electrode by a tilted implantation of impurity ions of the first conductivity type using the gate electrode as a mask to form an embedded region of the second conductivity type, before or after forming source/drain regions separated from the embedded region by implantation of impurity ions of the second conductivity type from above the substrate.

BRIEF DESCRIPTION OF THE DRAWINGS

The present invention will be better understood from the follow g detailed description of preferred embodiments of the invention, taken in conjunction with the accompanying drawings, in which.

DETAILED DESCRIPTION OF THE PREFERRED EMBODIMENTS

Figure 1:
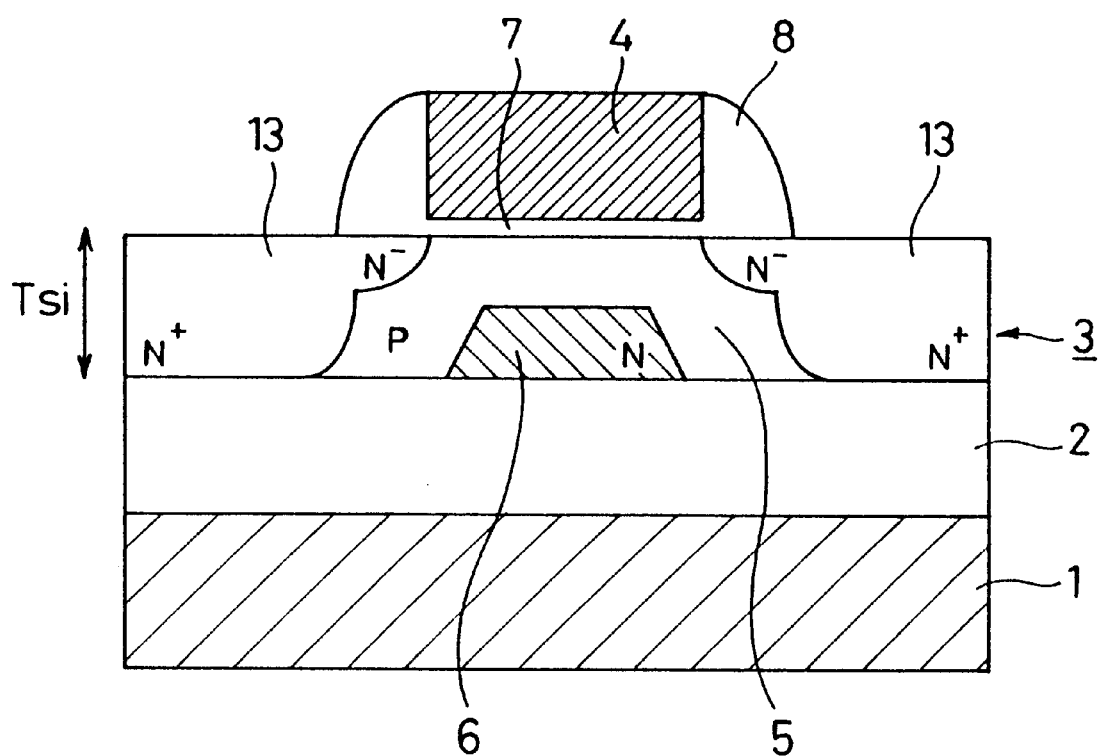
FIG. 1 is a schematic cross section of an essential portion illustrating an embodiment of a SOI.MOSFET according to the present invention.

The present invention provides a SOI MOSFET structure with a fully depleted channel on a relatively thick top Si film.

A substrate, a buried oxide film, and a top semiconductor layer in the SOI.MOSFET of the present invention are those generally used in fabricating a semiconductor device having a SOI.MOSFET structure. For example, the substrate may be a semiconductor substrate such as silicon or germanium, a compound semiconductor such as GaAs or InGaAs, an insulating substrate such as sapphire, quartz, glass, plastic or the like. The substrate is provided thereon with a buried oxide film and a top semiconductor layer which are mentioned later. This substrate could be a bonded SOI (BSOI) or SIMOX (Separation by Implantation of Oxygen) type substrate.

The buried oxide film may be formed of, for example, $SiO_2$ to a thickness satisfying a later-mentioned relationship. The thickness of the buried oxide film may be varied suitably in accordance with other conditions, as shown in the following formula. For example, the specific thickness of the buried oxide film may be about 50 nm to about 400 nm.

The top semiconductor layer is a semiconductor thin film functioning as an active layer for forming a transistor and may be formed to a thickness satisfying the later-mentioned relationship. The thickness of the top semiconductor layer may be varied suitably in accordance with other conditions, as shown in the following formula. Preferably, the specific thickness of the top semiconductor layer may be, for example, about 100 nm to about 500 nm, more preferably about 100 to about 200 nm.

A surface of the top semiconductor layer, in which a channel region of the transistor is formed, preferably has an impurity concentration satisfying the later-mentioned relationship so as to fully deplete the channel region and to control a threshold voltage. The impurity concentration of the top semiconductor layer surface may be varied suitably in accordance with other conditions, as shown in the following formula. For example, in order to set the threshold voltage to be about 0.2 to about 0.6 V, the top semiconductor layer surface may be formed by implanting impurity ions of a first conductivity type at a dose of about $0.5 \times 10^{12}$ to about $3 \times 10^{12}$ ions/cm$^2$ so that a final impurity concentration of the top semiconductor layer surface will be about $5 \times 10^{16}$ to about $3 \times 10^{17}$ ions/cm$^3$.

A gate electrode is formed on the top semiconductor layer with a gate oxide film interposed therebetween; and, further, source/drain regions of a second conductivity type are formed in the top semiconductor layer and on both sides of the gate electrode to constitute the transistor.

The gate oxide film may be formed to have a thickness such that it functions generally as a gate oxide film and satisfies the later-mentioned relationship. The thickness of the gate oxide film may be varied suitably in accordance with other conditions, as shown in the following formula. For example, the specific thickness of the gate oxide film is preferably about 5 to about 10 nm, more preferably about 5 to about 8 nm.

The gate electrode is preferably formed to a thickness of about 150 to about 300 nm with polysilicon, a silicide of a refractory metal such as W, Ta, Ti or Mo, a polycide of these silicides, a different metal or the like. Here, the gate electrode may be provided with a sidewall spacer formed of an insulating film having a thickness of about 100 to about 200 nm to constrain the lateral diffusion of impurity ions which are implanted for forming the later-mentioned source/drain regions. The source/drain regions contain the impurity ions of the second conductivity type at a concentration of about $1 \times 10^{20}$ to about $1 \times 10^{21}$ ions/cm$^3$. The source/drain regions may each include shallow extension regions which may have a concentration of a lower level as a LDD structure and are formed at an end of the source/drain region adjacent to the channel. Alternatively, the source/drain regions may each include regions which may have a concentration of the same level or a concentration of a higher level and may have a depth a little smaller than the junction depth of the source/drain regions.

The SOI.MOSFET according to the present invention has an embedded region of the second conductivity type disposed between the source/drain regions in the top semiconductor layer and underneath the gate electrode and separated from the source/drain regions and from a top semiconductor/gate oxide interface. This embedded region is used to fully deplete the channel region by contact potential with the channel region, so that there is no need for the embedded region itself to be fully depleted. For this purpose, the embedded region may have a junction depth, an impurity concentration and the like that satisfy the later-mentioned relationship. The junction depth and the impurity concentration of the embedded region may vary suitably in accordance with other conditions, as shown in the following formula. For example, the specific junction depth of the embedded region is preferably about 50 to about 450 nm if the top semiconductor layer has a thickness of about 100 to about 500 nm. The impurity concentration of the embedded region may be, for example, about $3 \times 10^{16}$ to about $1 \times 10^{18}$ ions/cm$^3$.

Preferably, the embedded region is floating and in contact with the buried oxide/top semiconductor interface to be coupled to the substrate bias through capacitive coupling with the buried oxide film and the substrate. Here, although the embedded region is explained as a second conductivity type region, the embedded region is N-type in the case of an enhanced mode NMOSFET, and it is P-type in the case of an enhanced mode PMOSFET.

Figure 3:
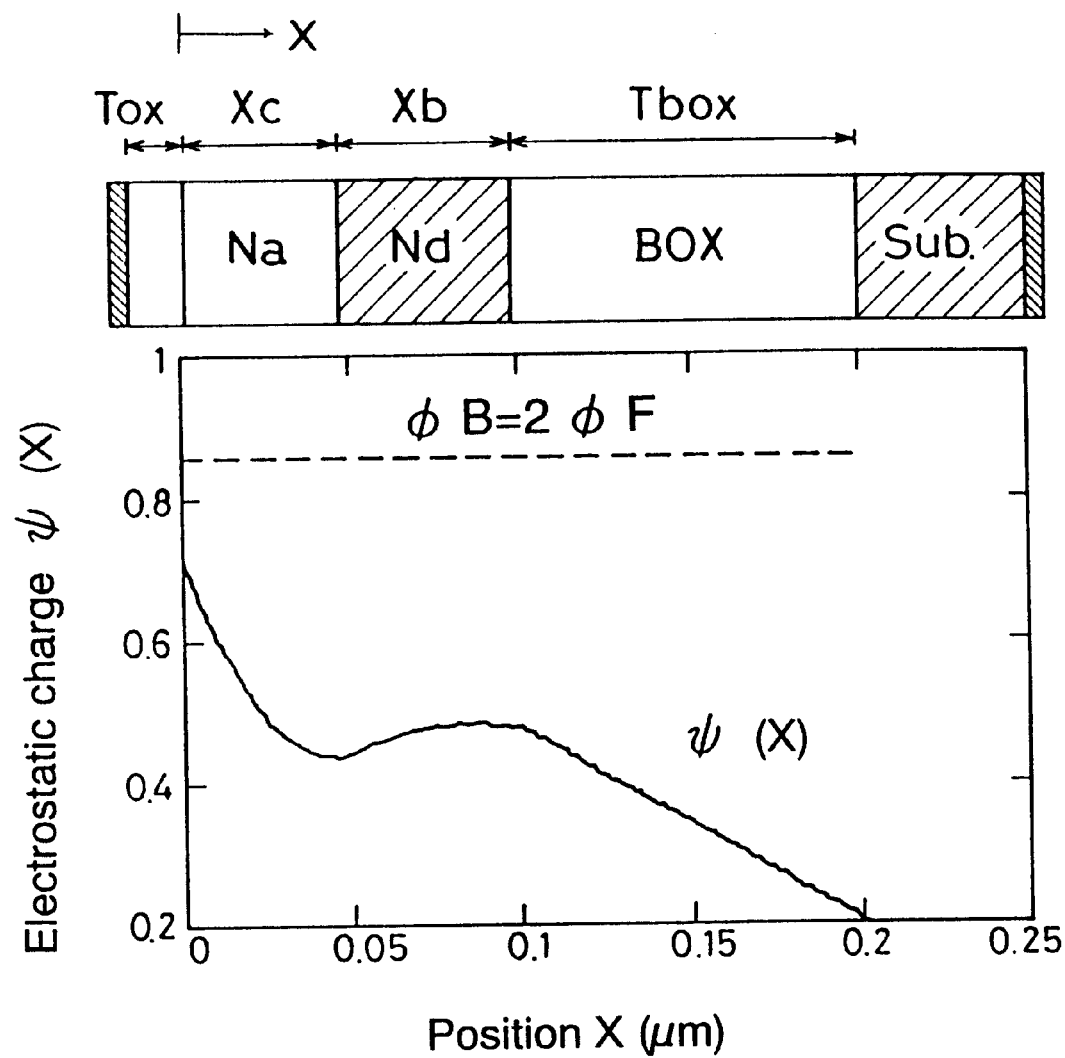
FIG. 3 is a view showing an electrostatic potential distribution in a depth direction within a channel region of the SOI.MOSFET according to the present invention.
Figure 4A:
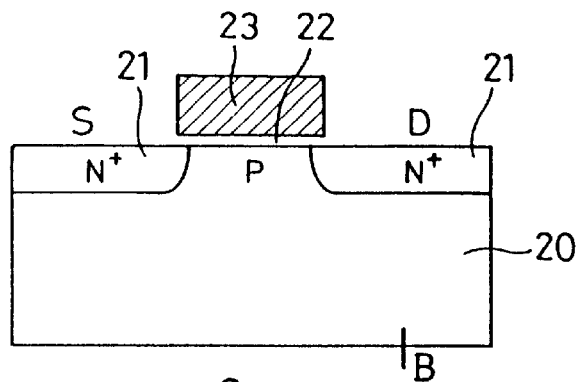
FIG. 4(a) is a schematic cross section of a conventional MOSFET fabricated on a bulk Si.
Figure 4B:
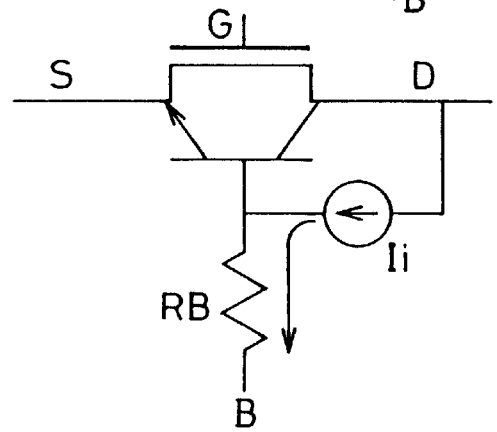
FIG. 4(b) is a view showing an equivalent electric circuit including a bipolar NPN transistor parasitically generated in this MOSFET structure of FIG. 4(a)
Figure 5A:
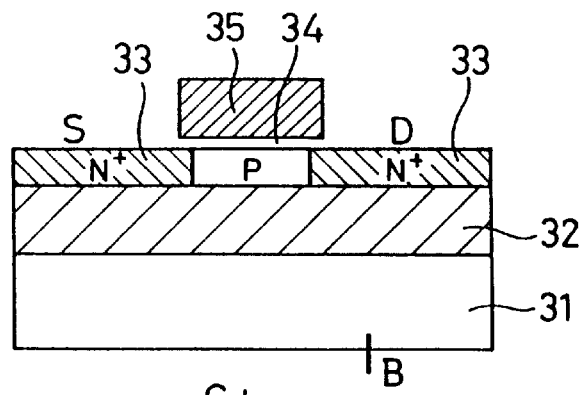
FIG. 5(a) is a schematic cross section of a conventional SOI.MOSFET.
Figure 5B:
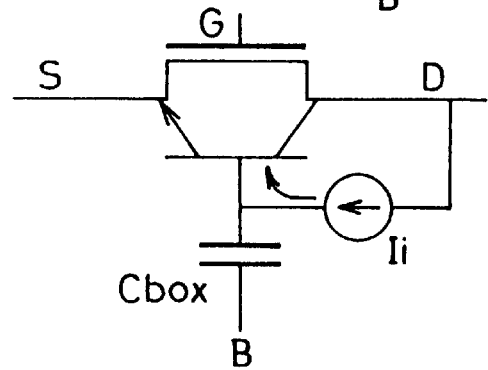
FIG. 5(b) is a view showing an equivalent electric circuit including a bipolar NPN transistor parasitically generated in this MOSFET structure of FIG. 5(a)
Figure 6:
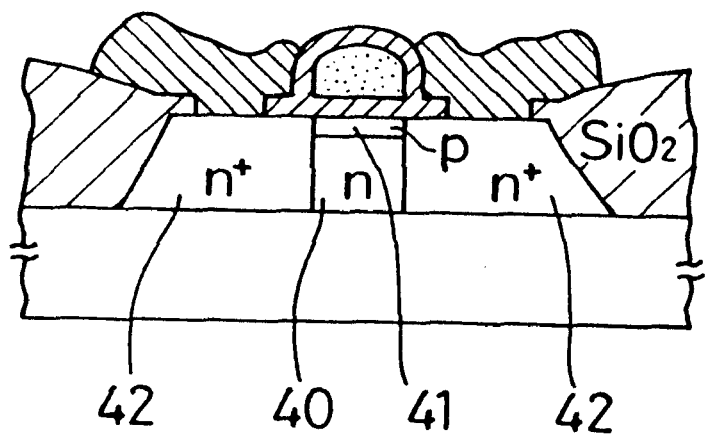
FIG. 6 is a schematic cross section of another conventional SOI.MOSFET.
Figure 7:
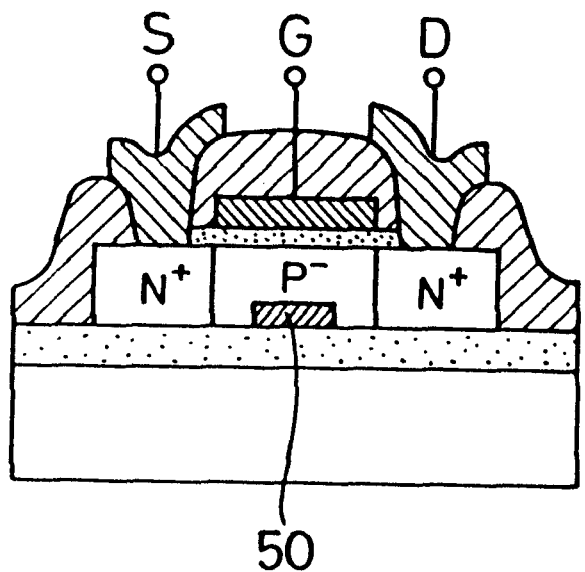
FIG. 7 is a schematic cross section of still another conventional SOI.MOSFET.

With reference to FIG. 3, an explanation is given on an electrostatic potential distribution in the depth direction within the channel region of the SOI.MOSFET shown in FIG. 1.

In FIG. 3, the gate oxide thickness is Tox; the surface channel (P-type) has a doping level Na and a thickness Xc; and the embedded region has a thickness Xb and a doping level Nd. The top semiconductor layer thickness is then Tsi=Xc+Xb. The buried oxide thickness is Tbox and the bias voltages are Vg and Vb for the gate electrode and the substrate, respectively.

The threshold voltage Vth for the SOI.MOSFET proposed in FIG. 1 is then given by:

$$Vth = Vfb + \Phi B \cdot \frac{Cdt}{Ct} + \frac{q \cdot (Na \cdot Xc - Nd \cdot Xb)}{Cox \cdot \left(1 + \frac{Cboxe}{Cch}\right)} +$$

$$H \cdot \frac{Cdt}{Cox} - Vb1 \cdot \left(\frac{Cbox}{Cox}\right) \cdot \left(1 - \frac{Cboxe}{Cjb}\right)$$

$$Cboxe = \frac{1}{\frac{1}{Cjb} + \frac{1}{Cbox}}$$

$$Cdt = \frac{1}{\frac{1}{Cch} + \frac{1}{Cjb} + \frac{1}{Cbox}}$$

$$Ct = \frac{1}{\frac{1}{Cox} + \frac{1}{Cch} + \frac{1}{Cjb} + \frac{1}{Cbox}}$$

$$H = \frac{q \cdot (Na \cdot Xc^2 + Nd \cdot Xb^2)}{2 \cdot \varepsilon}$$

The surface channel is depleted from the gate oxide/top semiconductor interface by Xcs, and a depletion region extends from the buried PN junction (between the embedded region and the channel region) into the channel region by Xbp:

$Xcs = [2\epsilon\Phi B/q\, Na]^{\frac{1}{2}}$ $Xbp = [2\epsilon(Nd/Na)Vbi/q(Na+Nd)]^{\frac{1}{2}}$ where Vbi is the PN junction built-in potential.

Therefore, the surface channel region is fully depleted when $Xc < Xcs + Xbp$

In the process for fabricating a SOI.MOSFET according to the present invention, a SOI substrate is used in which the top semiconductor layer is doped as to become a semiconductor film of the second conductivity type. This doping may be achieved by implanting impurity ions of the second conductivity type, followed by an annealing treatment under a desired condition.

Subsequently, impurity ions of the first conductivity type are implanted into a surface of the top semiconductor layer in the step (ii). This implantation of the impurity ions of the first conductivity type is carried out uniformly on the entire surface of the top semiconductor layer in order to fully deplete the channel region and to control the threshold voltage of the channel region. At this time, the impurity ions are implanted preferably at an implantation energy of about 10 to about 20 keV, though it depends on the dose of the implantation, the thickness of the top semiconductor layer and the like. After the implantation of the impurity ions, an annealing treatment is preferably carried out under an arbitrary condition.

A gate electrode is formed on the resulting substrate in the step (iii). The gate electrode may be formed by depositing an electrically conductive material for the gate electrode to a desired thickness on the entire substrate and then patterning it to a desired shape by a known technique, for example, photolithography and etching method. Here, a field oxide film is preferably formed by a LOCOS method or the like to define an active region before forming the gate electrode or before implanting impurity ions into the top semiconductor layer in the step (ii).

Subsequently, impurity ions of the first conductivity type are implanted by a tilted implantation in the step (iv) using, as a mask, the gate electrode obtained in the above step. This implantation of the impurity ions is for forming a deep portion of the channel region adjacent to the later-mentioned source/drain regions and is preferably carried out with a tilted angle of about 30 to about 50° at an implantation energy adjusted to obtain an impurity concentration peak at around the center of the top semiconductor layer. Specifically, in the case where the first conductivity type impurity is $^{11}B^+$, the implantation energy may be about 30 to about 80 keV, whereas in the case of $^{31}P^+$ the implantation energy may be about 80 to about 150 keV. Through this impurity implantation, almost all of the top semiconductor layer (except a portion underneath the gate electrode) is converted into a first conductivity type region, whereby the above-mentioned embedded region of the second conductivity type is formed underneath the gate electrode.

Further, impurity ions of the second conductivity type are implanted from above the substrate using the gate electrode as a mask to form the source/drain regions.

Here, in the step (iv), the tilted implantation may be carried out before the implantation from above the substrate, or vice versa.

In the step (iv), after the above-mentioned tilted implantation, impurity ions of the second conductivity type may be implanted from above the substrate to form first portions of the source/drain regions and then sidewall spacers are formed adjacent to the gate electrode, impurity ions of the second conductivity type may be implanted from above the substrate using the gate electrode and the sidewall spacers as a mask to form second portions of the source/drain regions. Alternatively, impurity ions of the second conductivity type may be implanted from above the substrate to form first regions of the source/drain regions before the above-mentioned tilted implantation, and then, sidewall spacers are formed adjacent to the gate electrode, impurity ions of the second conductivity type may be implanted from above the substrate using the gate electrode and the sidewall spacers as a mask to form second portions of the source/drain regions. As previously described, the first portions of the source/drain regions are shallow extension regions formed at an end of the source/drain regions adjacent to the channel and having a concentration of a lower level as a LDD structure. Alternatively, the first portions are regions having a concentration of the same level or a higher level and having a depth a little smaller than the junction depth of the second portions of the source/drain regions.

By forming the source/drain regions through the two-step implantation of impurity ions, hot electrons generated at the end of the source/drain regions can be alleviated and the separation of the embedded region from the source/drain regions can be fully ensured, eliminating the need for additional margin in the fabricating process and further reducing the area occupied by the SOI.MOSFET.

Further, in the present invention, after forming the SOI.MOSFET through the above steps, fabrication of the device can be completed by a desired interconnect metallization and the like. At this time, a salicide process may be carried out at least on the source/drain regions and further on the gate electrode. Namely, since the top semiconductor layer has a comparatively large thickness in the present invention, the salicide process can be carried out without penetrating through the top semiconductor layer.

Hereafter, an embodiment of the SOI.MOSFET according to the present invention is explained with reference to the attached drawings.

Referring to FIG. 1, the SOI.MOSFET of this embodiment is mainly composed of a silicon substrate 1, a buried oxide film 2, a top silicon layer 3, a gate insulating film 7, a gate electrode 4 with sidewall spacers 8, source/drain regions 13 of N-type having the LDD structure and an embedded region 6 of N-type. A channel region 5 having a fully depleted surface channel (P-type) with an impurity concentration adjusted according to the above formula is disposed between the source/drain regions 13 in the top silicon layer 3.

The embedded region 6 is N-type which is the same conductivity type as the source/drain regions 13 and which is different from the conductivity type of the surface channel. The embedded region 6 is separated from the source/drain regions 13 and from the gate oxide/surface channel interface. Although the embedded region 6 is floating, the embedded region 6 is in contact with the buried oxide 2 and is capacitively coupled to the substrate potential through a capacitor formed by the embedded region 6, the buried oxide film 2 and the substrate 1.

Here, the contact potential between the surface channel (P-type) and the embedded region 6 is used to fully deplete the surface channel. As previously described, since the embedded region 6 is separated from the source/drain regions 13 by the channel region 5, there is no need for the embedded region 6 itself to be fully depleted.

Next, the process for fabricating the SOI.MOSFET of this embodiment is hereafter explained.

Figure 2A:
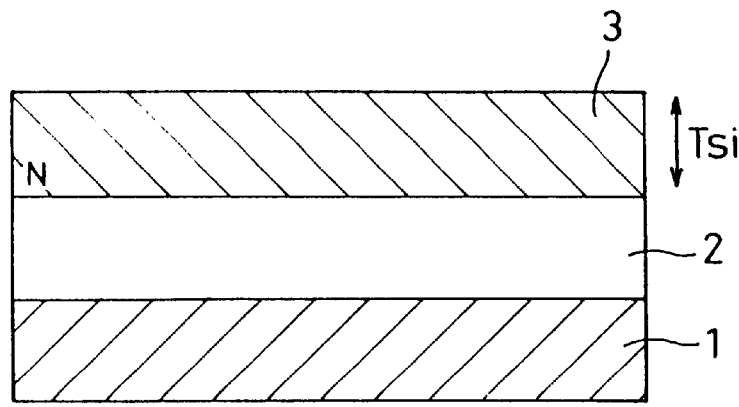
FIGS. 2(a) to 2(f) are schematic cross sections of the essential portion illustrating a process for manufacturing the SOI.MOSFET according to the present invention.

FIG. 2(a) refers to the starting SOI substrate to fabricate the SOI.MOSFET device of this embodiment. The SOI substrate may have been formed by any conventional technique such as SOS (Silicon On Sapphire), SIMOX (Silicon Separation by ion Implantation of Oxygen) and BSOI (Bonded SOI). In FIG. 2(a) the substrate 1 may be a semiconductor like silicon and the insulating layer 2 may be $SiO_2$. In this case, the thickness of the $SiO_2$ layer 2 is Tbox=70 to 500 nm. The top silicon film 3 is approximately Tsi=100 nm thick.

Subsequently, a device isolation film (not shown) was formed on the resulting substrate 1 by LOCOS method to define an active region. Further, $^{31}P^+$ions were implanted uniformly into the entire surface of the top silicon layer 3 at a dose of, for example, about $6 \times 10^{11} cm^{-2}$ and an implantation energy of, for example, about 40 keV followed by an annealing treatment at about 900° C. for about 60 minutes to form the top silicon layer 3 of N-type having a final impurity concentration of approximately $Nd = 4 \times 10^{16} cm^{-}$.

Figure 2B:
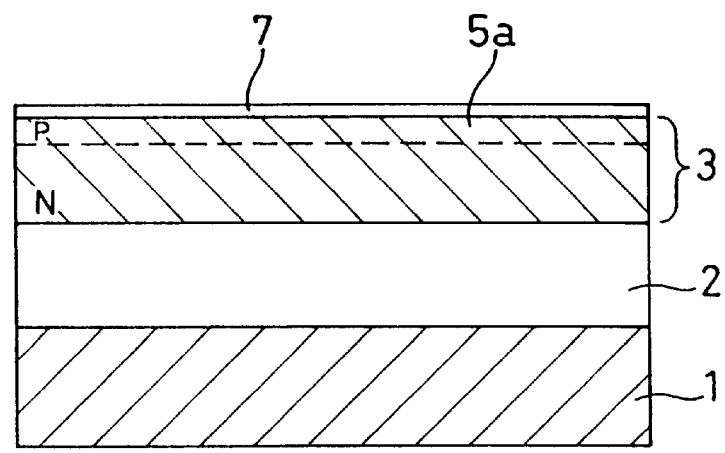

Further, in order to control the impurity concentration and the threshold voltage of the surface of the top silicon layer 3, $^{49}BF_2$ ions were implanted at an implantation energy of about 15 keV to form a surface channel 5a of P-type in a surface of the top silicon layer 3, as shown in FIG. 2(b). At this time, an implantation dose of about $0.5 \times 10^{12}$ to about $3 \times 10^{12} cm^{-2}$ was adopted to set the threshold voltage in the range of about 0.2 to about 0.6V. After the channel implantation, a gate oxide film 7 was grown on the top silicon layer 3 to a thickness of about 7 nm by thermal oxidation.

Figure 2C:
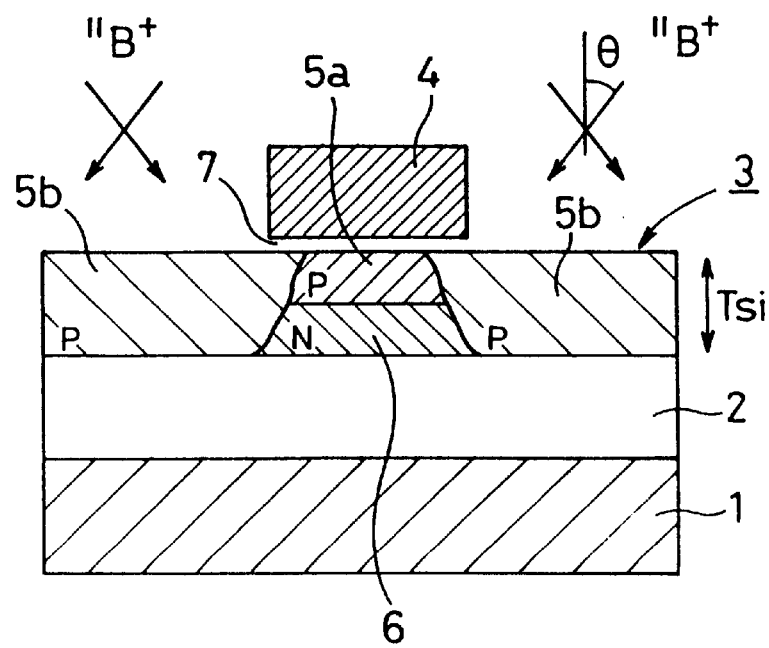

Thereafter, a polycrystalline silicon film was deposited as a gate electrode material to a thickness of about 200 nm by CVD method using a silane-based gas, as shown in FIG. 2(c). The gate electrode 4 was then patterned using a known photolithography and etching technique.

After the gate electrode formation and using the gate electrode 4 as a self-aligned mask, P-type impurity ions such as $^{11}B+$ions (i.e. of the same conductivity type as the surface channel 5a ) were implanted into a comparatively deep portion of the top silicon layer 3 to form a P-type region 5b and to form an embedded region 6 of N-type having a thickness of about 50 nm under the surface channel 5a underneath the gate electrode 4. To penetrate underneath the gate electrode 4, this implantation was done, for example, with a tilted angle of about 30 to 50° at an implantation energy of about 50 keV and a dose of about $7 \times 10^{12}$ to about $10 \times 10^{12} cm^{-2}$ so as to obtain an impurity concentration peak at around the center of the top silicon layer 3 and to reduce the short-channel effects.

Figure 2D:
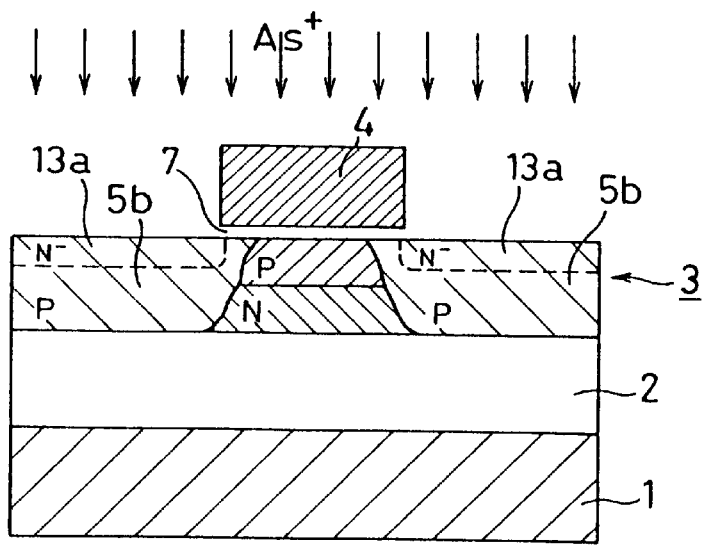

Then, using the gate electrode 4 as a mask, $As^+$ions were implanted from above the silicon substrate 1 at an implantation energy of about 20 keV and a dose of about $2 \times 10^{14} cm^{-2}$ to form shallow low-concentration extension regions 13a of the N-type source/drain regions, as shown in FIG. 2(d).

Figure 2E:
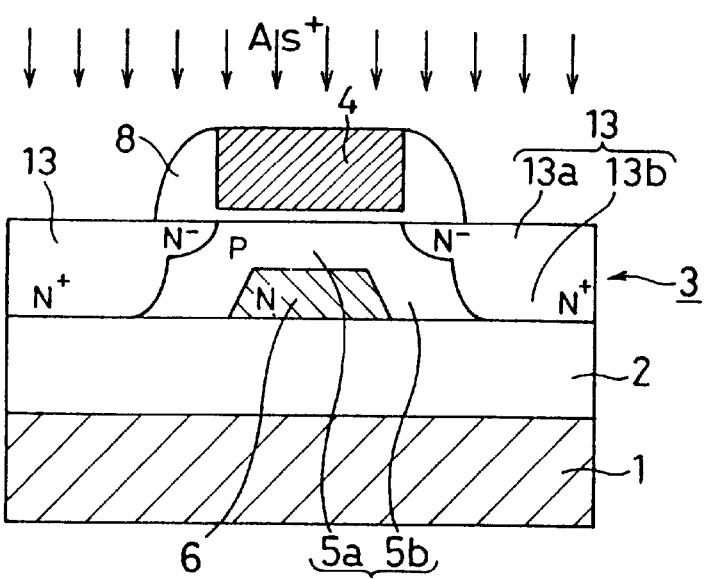

Further, a CVD oxide is deposited to a thickness of about 100 to about 200 nm and etched back to form sidewall spacers 8, as shown in FIG. 2(e). After that, using the gate electrode 4 and the sidewall spacers 8 as a mask, $As^+$ions were implanted at an implantation energy of about 40 keV and a dose of about $5 \times 10^{15} cm^{-2}$ to form high-concentration regions 13b of the source/drain regions, thereby forming the source/drain regions 13 with the LDD structure and forming the channel region 5. Proceeding in this way, the embedded region 6 was separated from the source/drain regions 13.

Figure 2F:
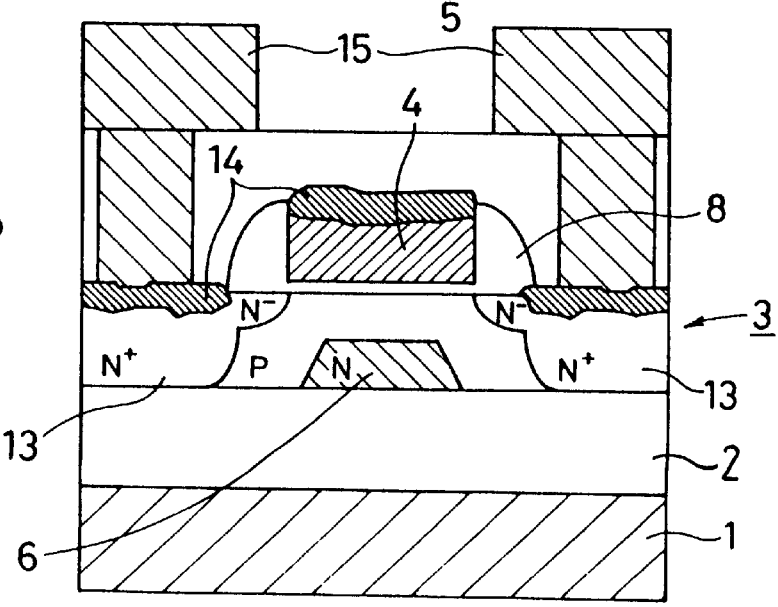

Then, as shown in FIG. 2(f), the surfaces of the gate electrode 4 and the source/drain regions 13 were subjected to a salicide process to form a silicide layer 14, and a metal interconnection 15 was formed by a metallization process to complete the SOI.MOSFET.

The present invention allows the formation of a SOI.MOSFET having a fully depleted surface channel on a comparatively thick top semiconductor layer, eliminating the conventional problem of "kink" effect. As a result, better control of the SOI.MOSFET electrical parameters is obtained, improving the manufacturing yield. Also, salicide process can be carried out in the metallization step. Further, integration process is facilitated and the process margin is enlarged, allowing to use a conventional etching technique.

Also, the present invention allows fabrication of the SOI.MOSFET without addition of complicated fabrication steps and facilitates the process control. Especially, if a two-step implantation of impurity ions is carried out in forming the source/drain regions, the process margin can be enlarged and the area occupied by the SOI.MOSFET can be further reduced.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What is claimed is:

1. A SOI MOSFET comprising:
   a substrate;
   a buried oxide film formed on the substrate;
   a top semiconductor layer formed on the buried oxide film;

a gate electrode formed on the top semiconductor layer with a gate oxide film interposed therebetween;

source/drain regions of a first conductivity type formed in the top semiconductor layer and on both sides of the gate electrode; and an embedded semiconductor region of the first conductivity type which is disposed in the top semiconductor layer and between the source/drain regions and is separated from the source/drain regions and from a top semiconductor/gate oxide interface, wherein the embedded region is electrically floating.

2. The SOI.MOSFET of claim 1, in which the embedded region is formed adjacent to a buried oxide/top semiconductor interface.

3. The SOI.MOSFET of claim 1, in which a surface of the top semiconductor layer is fully depleted by a depletion layer from the gate oxide/top semiconductor interface and a depletion layer from an embedded region/top semiconductor interface.

4. The SOI.MOSFET of claim 1, in which at least the source/drain regions include a salicide layer.

5. The SOI.MOSFET of claim 1, in which sidewall spacers are formed on a sidewall of the gate electrode and the source/drain regions include shallow extension regions.

6. A SOI MOSFET comprising:

a substrate;

an insulating layer formed on said substrate;

a semiconductor layer formed on said insulating layer;

source and drain regions formed in said semiconductor layer;

a gate electrode insulated from a channel region between said source and drain regions by a gate insulating film; and an embedded semiconductor region of the same conductivity type as said source and drain regions and formed in said semiconductor layer, said embedded region being spaced from said source and drain regions and from an interface between said gate insulating film and said channel region and said embedded region being electrically floating during operation of said SOI MOSFET.

7. The SOI MOSFET of claim 6, wherein said electrically floating embedded region is formed so as to contact said insulating layer.

8. The SOI MOSFET of claim 6, further comprising a salicide layer formed on said source and drain regions.

9. The SOI MOSFET of claim 6, wherein said source and drain regions have an LDD structure.

10. A SOI MOSFET comprising:

a substrate;

an insulating layer formed on said substrate;

a semiconductor layer formed on said insulating layer;

source and drain regions formed in said semiconductor layer;

a gate electrode insulated from a channel region between said source and drain regions by a gate insulating film; and an embedded semiconductor region of the same conductivity type as said source and drain regions and that is formed in said semiconductor layer so as to fully deplete the channel region, said embedded region being spaced from said source and drain regions and from an interface between said gate insulating film and said channel region.

11. The SOI MOSFET of claim 10, wherein said embedded region is formed so as to contact said insulating layer.

12. The SOI MOSFET of claim 10, further comprising a salicide layer formed on said source and drain regions.

13. The SOI MOSFET of claim 10, wherein said embedded region is electrically floating.

14. The SOI MOSFET of claim 10, wherein said source and drain regions have an LDD structure.

* * * * *